(12) United States Patent
Chen et al.

(10) Patent No.: US 9,257,978 B2
(45) Date of Patent: Feb. 9, 2016

(54) MULTIPLEX DRIVING CIRCUIT

(71) Applicant: AU Optronics Corp., Hsin-Chu (TW)

(72) Inventors: Chung-Chun Chen, Hsin-Chu (TW); Hsiao-Wen Wang, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/178,625

(22) Filed: Feb. 12, 2014

(65) Prior Publication Data

US 2014/0159799 A1 Jun. 12, 2014

Related U.S. Application Data

(62) Division of application No. 13/198,862, filed on Aug. 5, 2011, now Pat. No. 8,692,588.

(30) Foreign Application Priority Data

Dec. 6, 2010 (TW) .............................. 099142446 A

(51) Int. Cl.
*H03K 17/10* (2006.01)
*G09G 3/36* (2006.01)

(52) U.S. Cl.
CPC ............ *H03K 17/102* (2013.01); *G09G 3/3677* (2013.01); *G09G 2310/0286* (2013.01)

(58) Field of Classification Search
CPC ........... H05B 33/0815; H05B 33/0803; H05B 33/0827; G09G 3/3406; G09G 3/3413; G09G 3/342; G09G 3/3466

USPC ................ 327/437, 108, 109, 110, 111, 112; 377/64, 65, 66, 67, 68

See application file for complete search history.

(56) References Cited

U.S. PATENT DOCUMENTS

| 7,672,419 | B2 | 3/2010 | Chen et al. |
|---|---|---|---|
| 7,710,383 | B2 | 5/2010 | Fujita et al. |
| 7,792,237 | B2 | 9/2010 | Chen et al. |
| 8,054,935 | B2 | 11/2011 | Tsai et al. |
| 2001/0030557 | A1* | 10/2001 | Niimi .................. H03K 17/063 327/108 |
| 2009/0237341 | A1 | 9/2009 | Chen et al. |
| 2011/0012521 | A1* | 1/2011 | Byun et al. .................... 315/186 |

FOREIGN PATENT DOCUMENTS

| CN | 101256754 A | 9/2008 |
|---|---|---|
| CN | 101727859 A | 6/2010 |
| GB | 2072980 | 10/1981 |
| TW | 200830247 | 7/2008 |

* cited by examiner

*Primary Examiner* — John Poos
(74) *Attorney, Agent, or Firm* — WPAT, PC; Justin King

(57) ABSTRACT

A multiplex driving circuit receives m master signals and n slave signals, and includes m driving modules for generating m×n gate driving signals. Each driving module includes a voltage boost stage and n driving stages. The voltage boost stage is used for receiving a first master signal of the m master signals and converting the first master signal into a first high voltage signal, wherein a high logic level of the first master signal is increased to a highest voltage by the voltage boost stage. The n driving stages receives the n slave signals, respectively, and receives the first high voltage signal. In response to the highest voltage of the first high voltage signal, the n driving stages sequentially generates n gate driving signals according to the n slave signals.

5 Claims, 13 Drawing Sheets

MULTIPLEX DRIVING CIRCUIT

CROSS-REFERENCE TO RELATED APPLICATION

This is a divisional application of application Ser. No. 13/198,862, filed on Aug. 5, 2011 and allowed on Nov. 27, 2013. The entirety of the above-mentioned patent application is hereby incorporated by reference herein and made a part of this specification.

TECHNICAL FIELD

The disclosure relates to a multiplex driving circuit, and more particularly to a multiplex driving circuit for use with a LCD panel.

BACKGROUND

Generally, a LCD panel comprises plural gate lines. In addition, plural gate driving signals are sequentially received by the gate lines, and thus the pixels connected with the gate lines are sequentially turned on.

FIG. 1A is a schematic circuit diagram illustrating a multiplex driving circuit. FIG. 1B is a schematic timing waveform diagram illustrating associated signal processed by the multiplex driving circuit of FIG. 1A. As shown in FIG. 1A, the signals A1~A4 may be referred as master signals, and the signals $ENB1_y$~$ENB3_y$ may be referred as slave signals. The master signals A1~A4 are generated by a shift register 500.

As shown in FIG. 1B, the master signals A1~A4 that are non-overlapped pulses with the same width are sequentially generated. Each of the slave signals $ENB1_y$~$ENB3_y$ includes plural pulses with the same frequency but different phases. Please refer to FIG. 1B. A cycle period of each slave signal is equal to the pulse width of each master signal. In the three slave signals $ENB1_y$~$ENB3_y$, the duty cycle of each slave signal is ⅓, and the phase difference between every two adjacent slave signals is 120 degrees (i.e. 360/3=120).

Please refer to FIG. 1A again. Each master signal is transmitted to three driving stages 502. In addition, the slave signals are received by respective driving stages 502. Consequently, these driving stages sequentially output respective gate driving signal Y1~Y6, . . . , and so on. As shown in FIG. 1A, each driving stage of the multiplex driving circuit comprises a NAND gate 503 and an inverter 504. In other words, each driving stage of the multiplex driving circuit is implemented by many transistors.

SUMMARY

In accordance with an aspect, the present invention provides a multiplex driving circuit. The multiplex driving circuit receives m master signals and n slave signals, and includes m driving modules for generating m×n gate driving signals. Each driving module includes a voltage boost stage and n driving stages. The voltage boost stage is used for receiving a first master signal of the m master signals and converting the first master signal into a first high voltage signal, wherein a high logic level of the first master signal is increased to a highest voltage by the voltage boost stage. The n driving stages receives the n slave signals, respectively, and receives the first high voltage signal. In response to the highest voltage of the first high voltage signal, the n driving stages sequentially generates n gate driving signals according to the n slave signals.

In accordance with another aspect, the disclosure provides a multiplex driving circuit. The multiplex driving circuit receives a start signal, a first clock signal, a second clock signal, a high voltage, a low voltage signal and n slave signals, and includes m driving modules for generating m×n gate driving signals. An x-th driving module of the m driving modules includes an x-th shift register and n driving stages. The x-th shift register receives the first clock signal, the high voltage and the low voltage signal. According to a (x−1)-th master signal from a (x−1)-th shift register and a (x+1)-th master signal from a (x+1)-th shift register, the x-th shift register generates an x-th high voltage signal, an x-th master signal and an x-th control signal. The n driving stages receives the n slave signals, respectively, and receives the x-th high voltage signal. In response to the highest voltage of the x-th high voltage signal, the n driving stages sequentially generates n gate driving signals according to the n slave signals, wherein the highest voltage is greater than the high voltage.

DETAILED DESCRIPTION OF EMBODIMENTS

The disclosure will now be described more specifically with reference to the following embodiments. It is to be noted that the following descriptions of embodiments are presented herein for purpose of illustration and description only. It is not intended to be exhaustive or to be limited to the precise form disclosed.

Figure 1A:
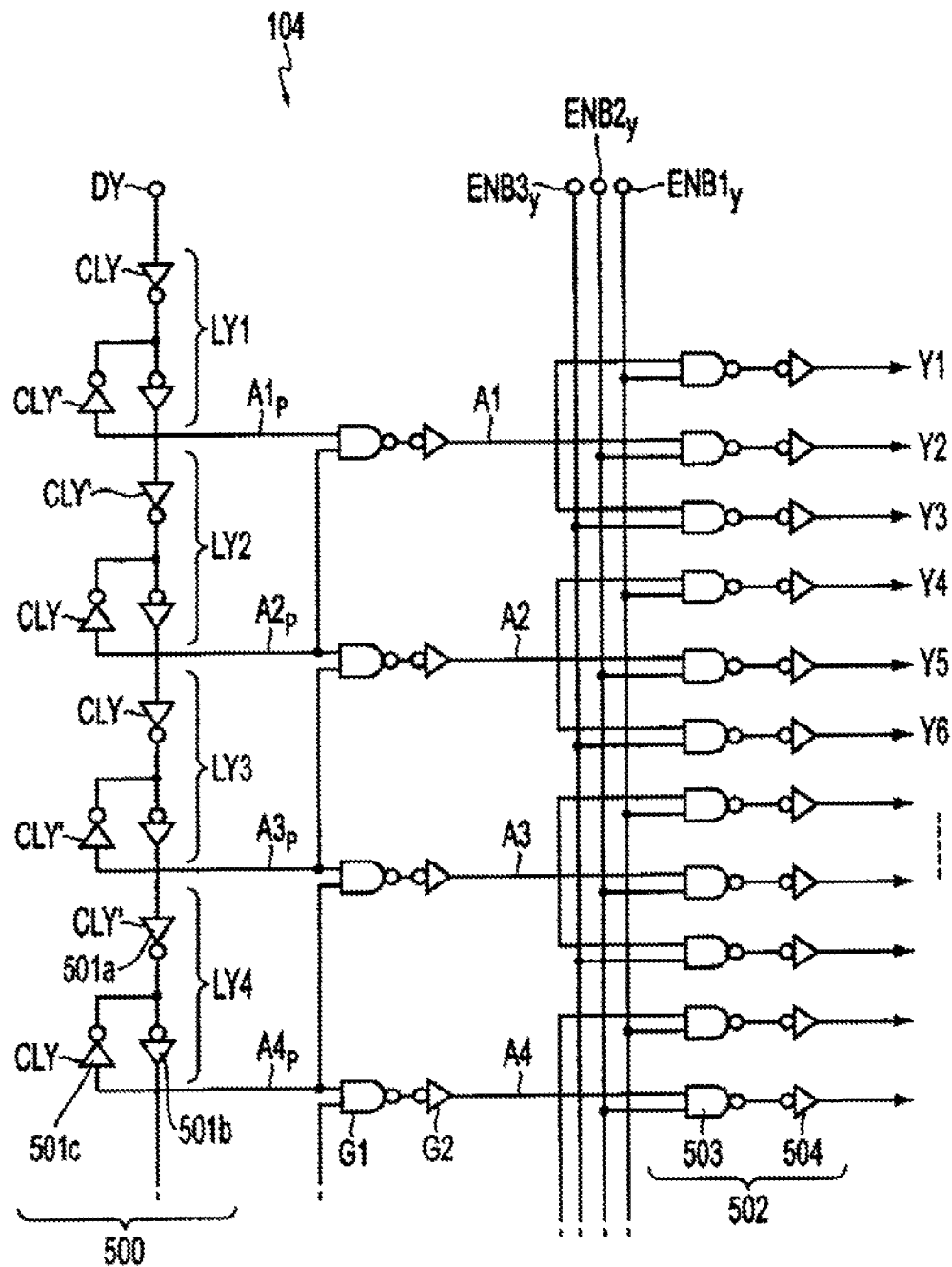
FIG. 1A is a schematic circuit diagram illustrating a multiplex driving circuit.
Figure 1B:
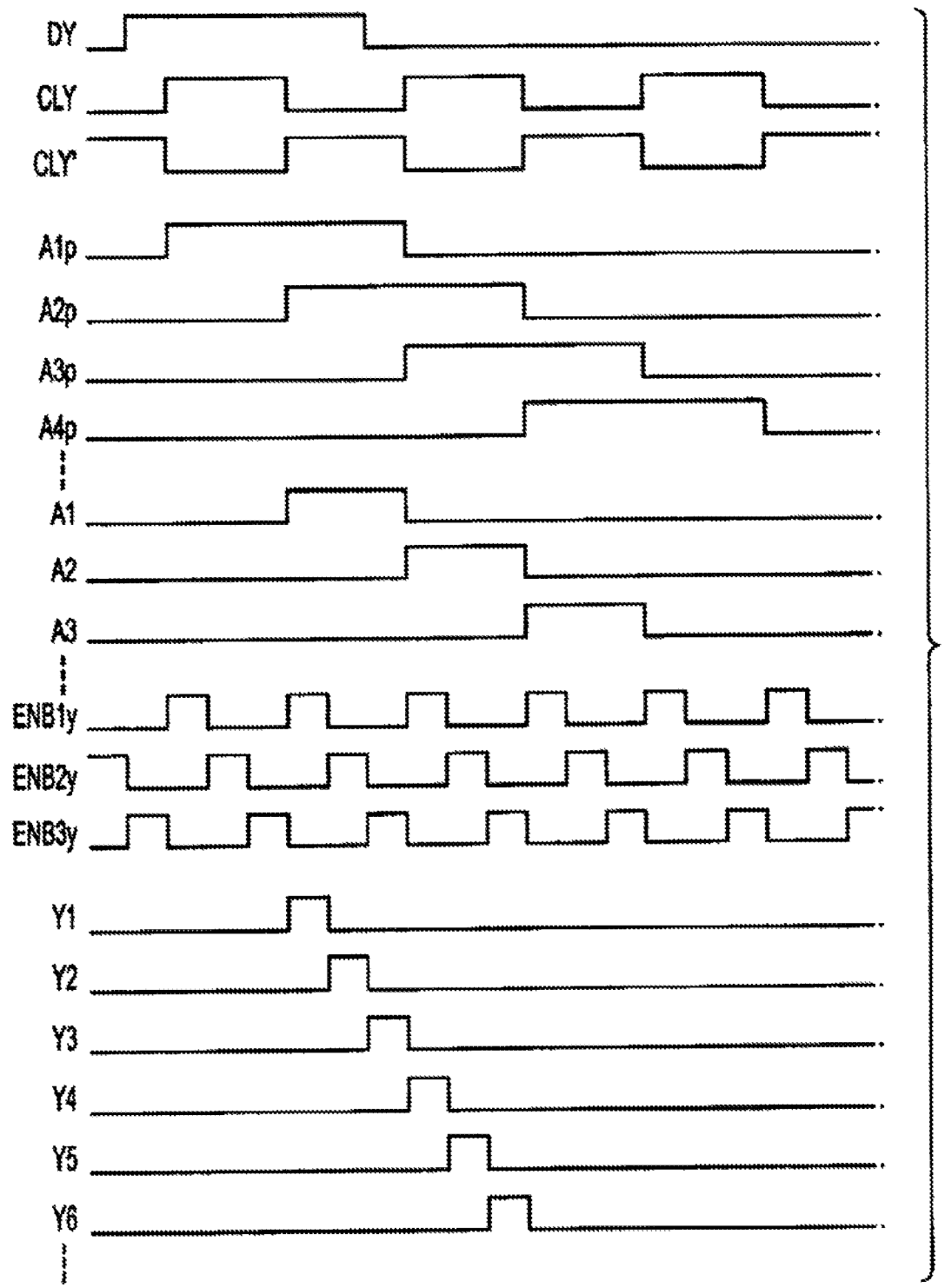
FIG. 1B is a schematic timing waveform diagram illustrating associated signal processed by the multiplex driving circuit of FIG. 1A.
Figure 2A:
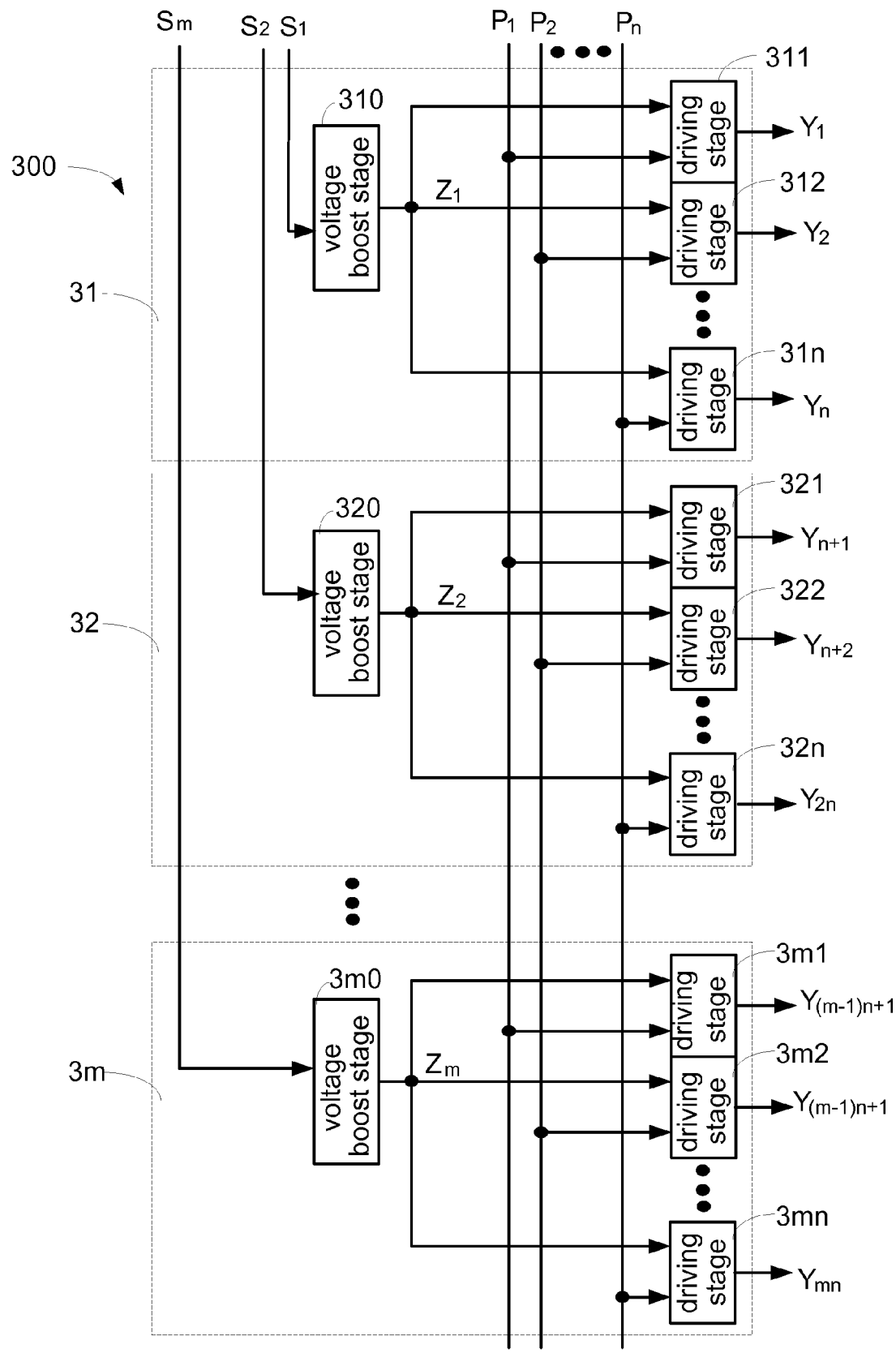
FIG. 2A is a schematic circuit diagram illustrating a multiplex driving circuit according to a first embodiment.
Figure 2B:
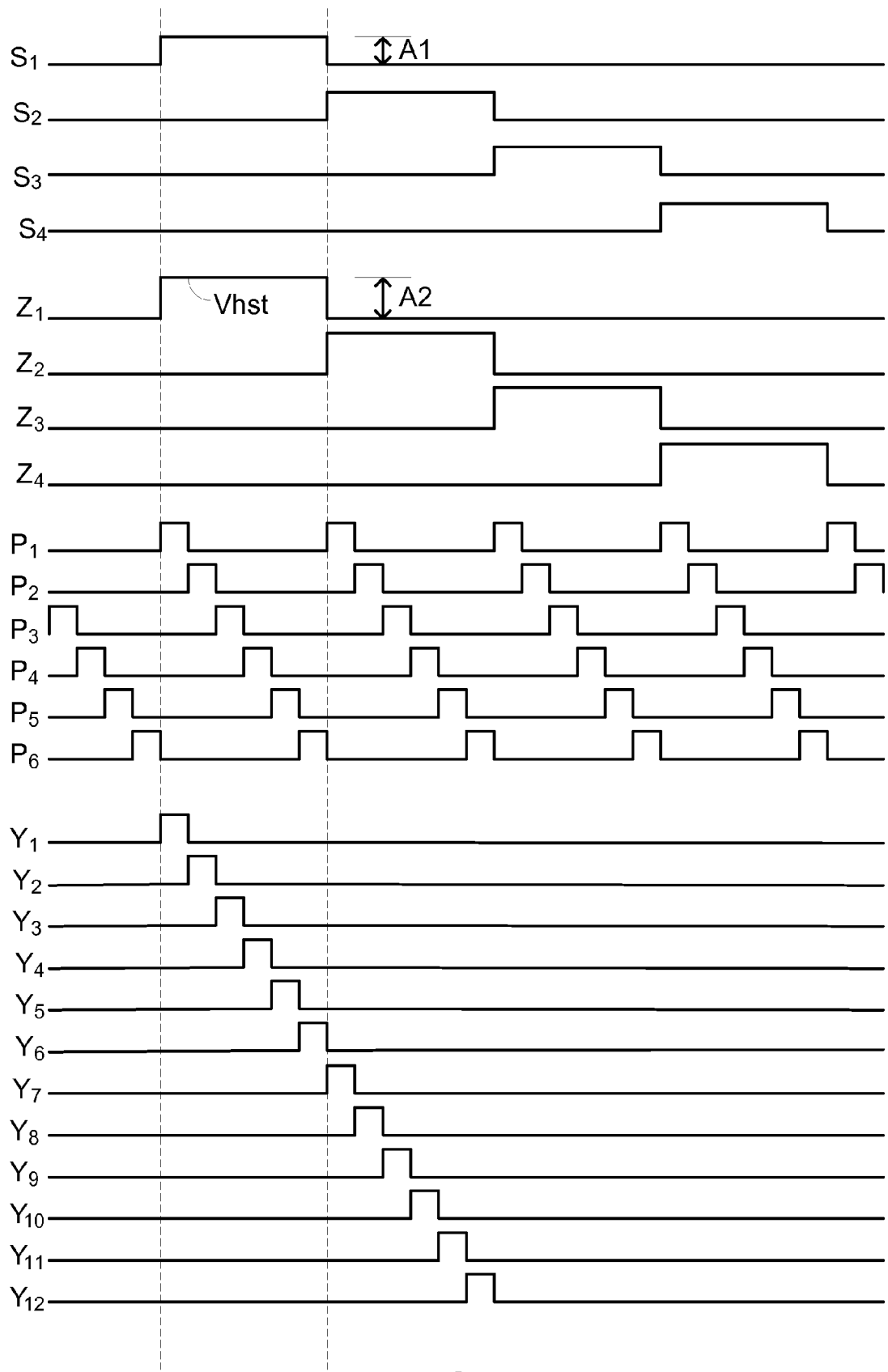
FIG. 2B is a schematic timing waveform diagram illustrating associated signal processed by the multiplex driving circuit of FIG. 2A.

FIG. 2A is a schematic circuit diagram illustrating a multiplex driving circuit according to a first embodiment. FIG. 2B is a schematic timing waveform diagram illustrating associated signal processed by the multiplex driving circuit of FIG. 2A. As shown in FIG. 2A, a set of master signals $S_1 \sim S_m$ and a set of slave signals $P_1 \sim P_n$ are received by the multiplex driving circuit 300. The multiplex driving circuit 300 comprises m driving modules 31~3m. Each of the driving modules 31~3m comprises a corresponding voltage boost stage and n driving stages. In such way, the multiplex driving circuit 300 may generate m×n gate driving signals $Y_1 \sim Y_{mn}$.

Take the first driving module 31 for example. The voltage boost stage 310 of the first driving module 31 received a first master signal $S_1$ and issues a first high voltage signal $Z_1$ to n driving stages 311~31n. In addition, n slave signals are respectively received by the n driving stages 311~31n. The gate driving signals $Y_1 \sim Y_n$ are generated when the first high voltage signal $Z_1$ and the corresponding slave signals are enabled.

In FIG. 2B, four master signals (m=4) and six slave signals (n=6) are illustrated. The master signals $S_1 \sim S_4$ that are non-overlapped pulses with the same width are sequentially generated. Each of the slave signals $P_1 \sim P_6$ includes plural positive pulses with the same frequency but different phases. As is seen from FIG. 2B, a cycle period of each slave signal is equal to the pulse width of each master signal. In the six slave signals $P_1 \sim P_6$, the duty cycle of each slave signal is ⅙, and the phase difference between every two adjacent slave signals is 60 degrees (i.e. 360/6=60).

In this embodiment, the master signals and the slave signals are all logic signals, wherein the amplitude between the high logic level and the low logic level is $A_1$. The amplitude of each of the high voltage signals $Z_1 \sim Z_4$ is $A_2$, wherein $A_2 > A_1$. Obviously, in response to the first master signal $S_1$ in the high level state, the first high voltage signal $Z_1$ is increased to a highest voltage $V_{hst}$ by the voltage boost stage 310 of the first driving module 31. In addition, the gate driving signals $Y_1 \sim Y_n$ are sequentially generated by the n driving stages 311~31n. Similarly, in response to the second master signal $S_2$ in the high level state, the second high voltage signal $Z_2$ is generated by the voltage boost stage 320 of the second driving module 32. In addition, the gate driving signals $Y_{n+1} \sim Y_{2n}$ are sequentially generated by the n driving stages 321~32n. The operations of other driving modules are similar to those of the first driving module, and are not redundantly described herein.

In the first embodiment, the master signals $S_1 \sim S_m$ and the slave signals $P_1 \sim P_n$ received by the multiplex driving circuit 300 are generated by a timing controller (not shown). The operations of the voltage boost stage and the driving stage will be illustrated later.

Figure 3A:
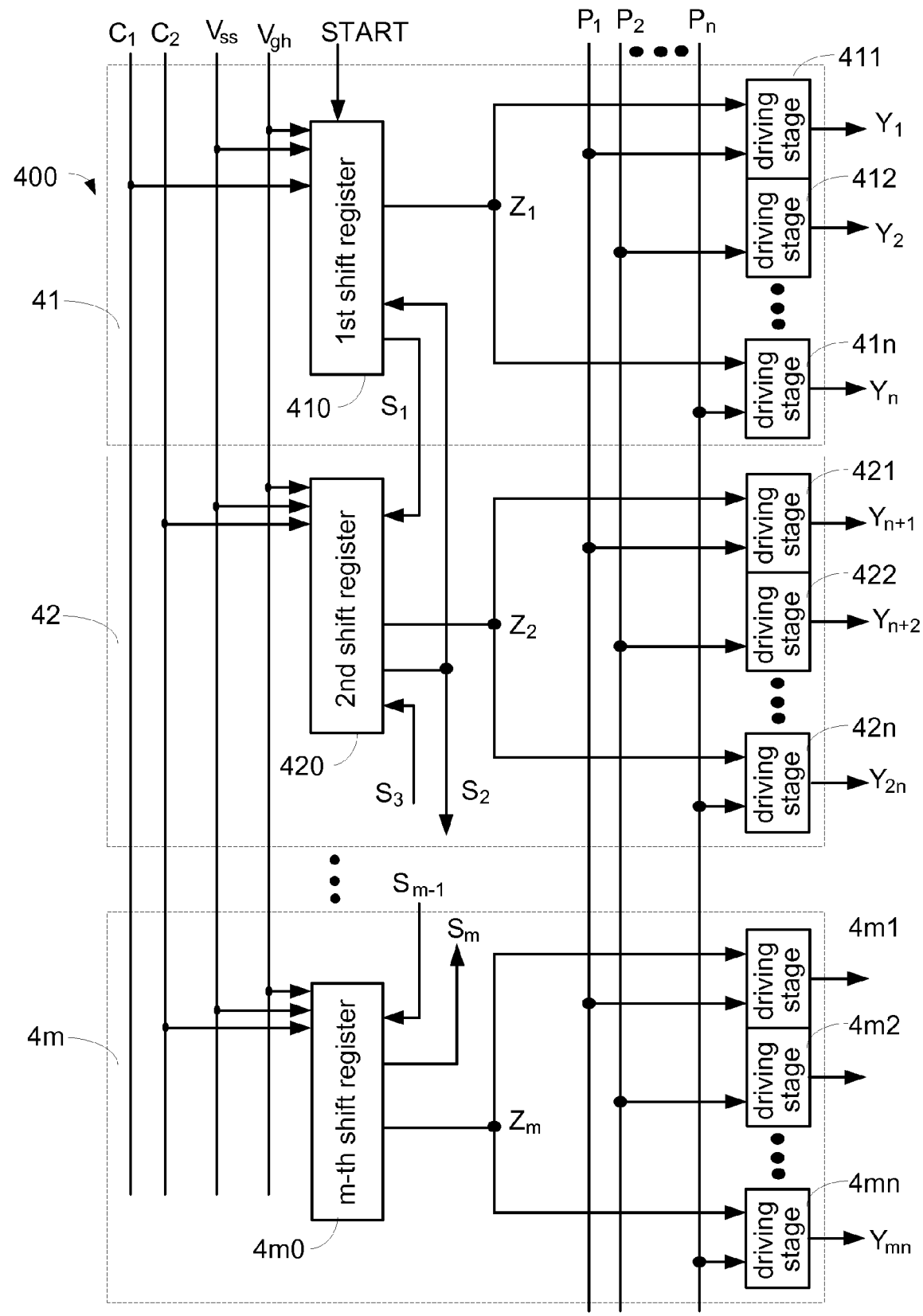
FIG. 3A is a schematic circuit diagram illustrating a multiplex driving circuit according to a second embodiment.
Figure 3B:
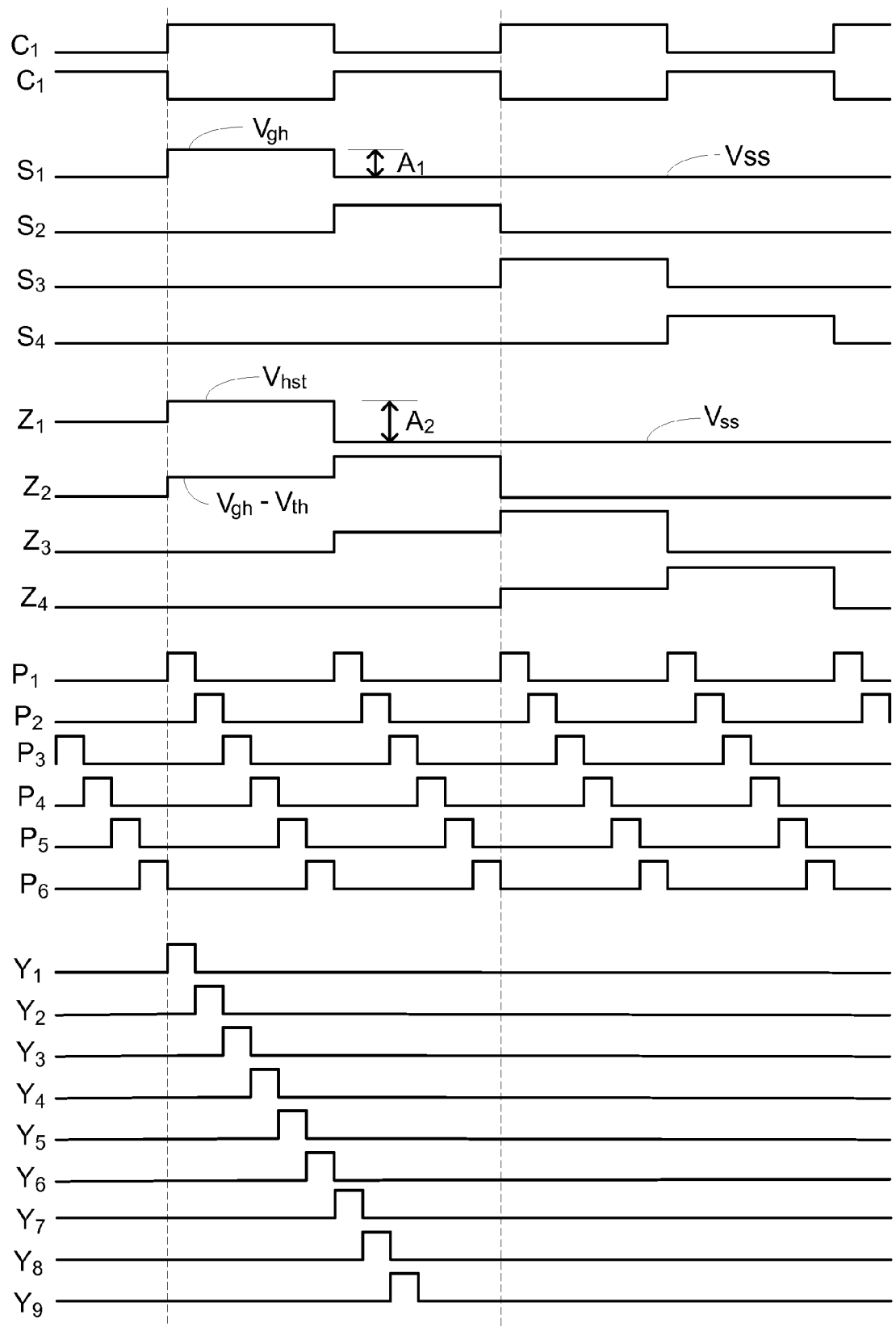
FIG. 3B is a schematic timing waveform diagram illustrating associated signal processed by the multiplex driving circuit of FIG. 3A.

FIG. 3A is a schematic circuit diagram illustrating a multiplex driving circuit according to a second embodiment. FIG. 3B is a schematic timing waveform diagram illustrating associated signal processed by the multiplex driving circuit of FIG. 3A. As shown in FIG. 3A, a first clock signal $C_1$, a second clock signal $C_2$, a low voltage signal $V_{ss}$, a high voltage $V_{gh}$, a start signal START and a set of slave signals $P_1 \sim P_n$ are received by the multiplex driving circuit 400. The multiplex driving circuit 400 comprises m driving modules 41~4m. Each of the driving modules 41~4m comprises a corresponding shift register and n driving stages. In such way, the multiplex driving circuit 400 may generate m×n gate driving signals $Y_1 \sim Y_{mn}$. The first clock signal $C_1$ and the second clock signal $C_2$ are complementary to each other. In this embodiment, the odd-numbered shift registers of the m driving modules 41~4m may receive the first clock signal $C_1$, the low voltage signal $V_{ss}$ and the high voltage $V_{gh}$. Whereas, the even-numbered shift registers of the m driving modules 41~4m may receive the second clock signal $C_2$, the low voltage signal $V_{ss}$ and the high voltage $V_{gh}$.

Alternatively, the even-numbered shift registers of the m driving modules 41~4m may receive the first clock signal $C_1$, the low voltage signal $V_{ss}$ and the gate high voltage $V_{gh}$, but the odd-numbered shift registers of the m driving modules 41~4m may receive the second clock signal $C_2$, the low voltage signal $V_{ss}$ and the gate high voltage $V_{gh}$. The operating principles are similar to those of the multiplex driving circuit shown in FIG. 3A. The operating multiplex driving circuit of FIG. 3A will be illustrated in more details as follows.

The shift registers are operated according to the first clock signal $C_1$, the second clock signal $C_2$, the low voltage signal $V_{ss}$, the gate high voltage $V_{gh}$ and the start signal START. In addition, each shift register comprises a corresponding voltage boost stage. Consequently, the shift register may generates a corresponding high voltage signal to n driving stages and issues a master signal to a next-stage shift register.

In response to the start signal START, the first shift register 410 is triggered to issue the first master signal $S_1$ to the second shift register 420 and issue the first high voltage signal $Z_1$ to the n driving stages 411~41n. In addition, corresponding n slave signals are respectively received by the n driving stages 411~41n. In response to the highest voltage $V_{hst}$ of the first high voltage signal $Z_1$ and the enabling states of the corresponding slave signals, the gate driving signals $Y_1 \sim Y_n$ are generated by the n driving stages 411~41n. Moreover, in response to the second master signal $S_2$ from the second shift register 420, the first shift register 410 stops generating the first high voltage signal $Z_1$.

Take the second driving unit 420 for example. In response to the first master signal $S_1$, the second shift register 420 issues the second master signal $S_2$ to the third shift register (not shown) and issues the second high voltage signal $Z_2$ to the n driving stages 421~42n. In addition, corresponding n slave signals are respectively received by the n driving stages 421~42n. In response to the highest voltage $V_{hst}$ of the second high voltage signal $Z_2$ and the enabling states of the corresponding slave signals, the gate driving signals $Y_{n+1} \sim Y_{2n}$ are generated by the n driving stages 421~42n. Moreover, in response to the third master signal $S_3$ from the third shift register (not shown), the second shift register 420 stops generating the second high voltage signal $Z_2$. The operating principles of other driving modules are similar to those of the first driving module, and are not redundantly described herein.

In FIG. 3B, four master signals (m=4) and six slave signals (n=6) are illustrated. According to the changes of the first clock signal $C_1$ and the second clock signal $C_2$, the four master signals $S_1 \sim S_4$ that are non-overlapped pulses with the same width are sequentially generated. Each of the slave signals $P_1 \sim P_6$ includes plural positive pulses with the same frequency but different phases. As is seen from FIG. 3B, a cycle period of each slave signal is equal to the pulse width of each master signal. In the six slave signals $P_1$~$P_6$, the duty cycle of each slave signal is ⅙, and the phase difference between every two adjacent slave signals is 60 degrees (i.e. 360/6=60).

In this embodiment, the master signals $S_1$~$S_4$ are logic signals. The high logic level of each master signal is equal to the gate high voltage $V_{gh}$. The low logic level of each master signal is equal to the low voltage signal $V_{ss}$. The amplitude $A_1$ is equal to $V_{gh}$–$V_{ss}$. The highest amplitude $A_2$ of each of the high voltage signals $Z_1$~$Z_4$ is $V_{hst}$–$V_{ss}$, wherein $A_2$>$A_1$. Obviously, in response to the first master signal $S_1$ in the high level state ($V_{gh}$), the first high voltage signal $Z_1$ of the first driving module 41 has the highest voltage $V_{hst}$. In addition, the gate driving signals $Y_1$~$Y_n$ are sequentially generated by the n driving stages 411~41n. Similarly, in response to the second master signal $S_2$ in the high level state ($V_{gh}$), the second high voltage signal $Z_2$ of the second driving module 42 has the highest voltage $V_{hst}$. In addition, the gate driving signals $Y_{n+1}$~$Y_{2n}$ are sequentially generated by the n driving stages 421~42n. The operations of other driving modules are similar to those of the first driving module, and are not redundantly described herein.

In the second embodiment of the multiplex driving circuit, all high voltage signals are generated by the voltage boost stages of the shift registers. The shift registers and the voltage boost stages will be illustrated in more details as follows.

Figure 4A:
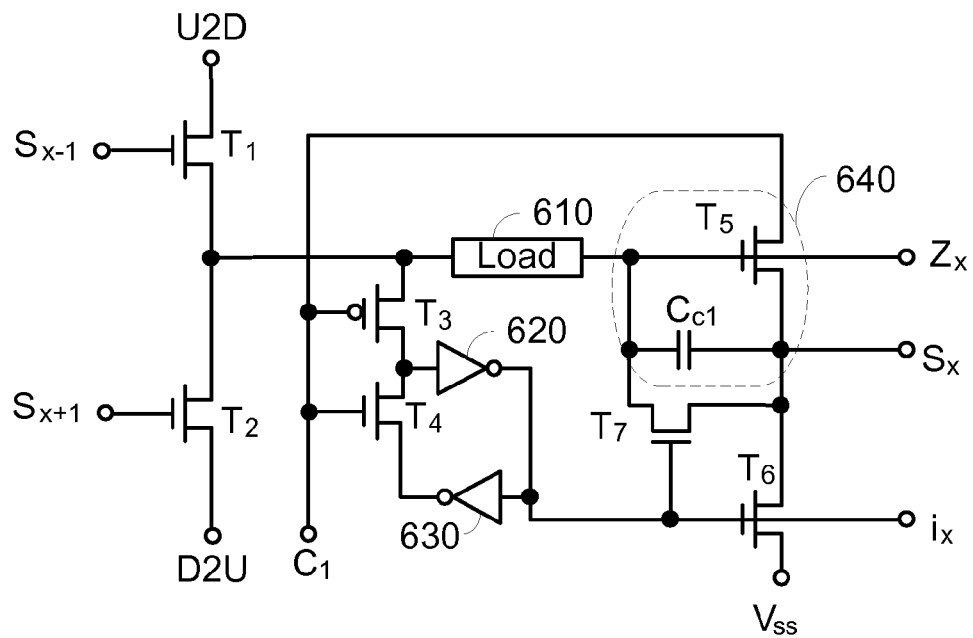
FIG. 4A is a schematic circuit diagram illustrating a first exemplary odd-numbered x-th shift register of the multiplex driving circuit according to an embodiment.
Figure 4B:
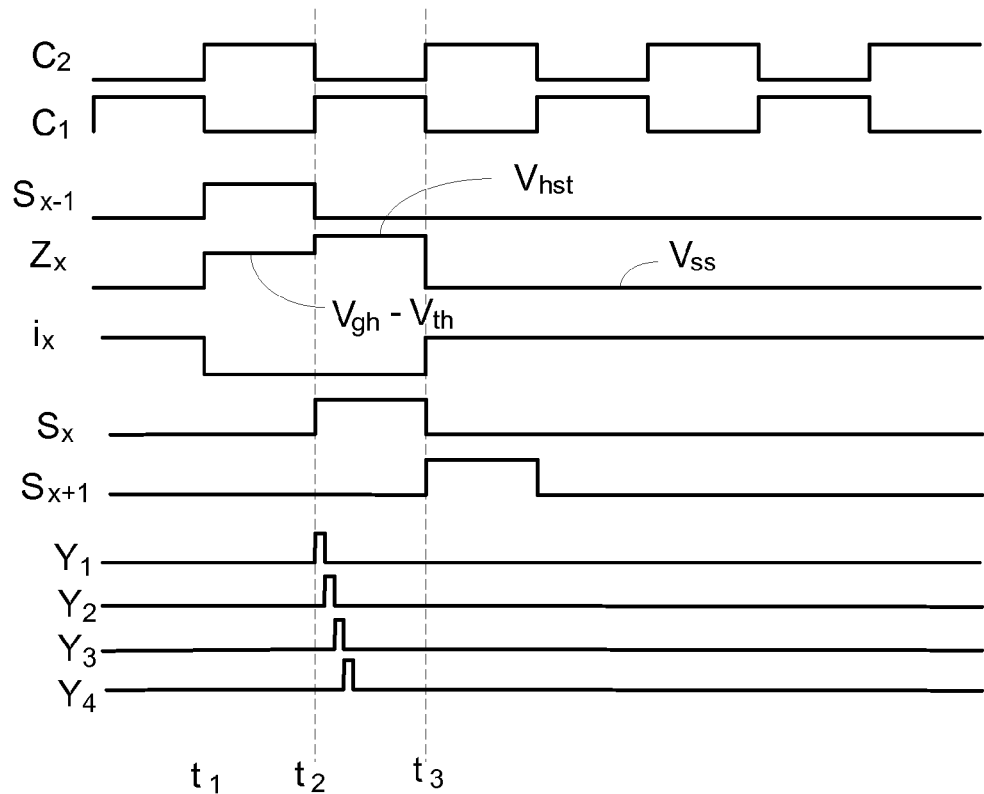
FIG. 4B is a schematic timing waveform diagram illustrating associated signal processed by the x-th shift register of FIG. 4A.
Figure 4C:
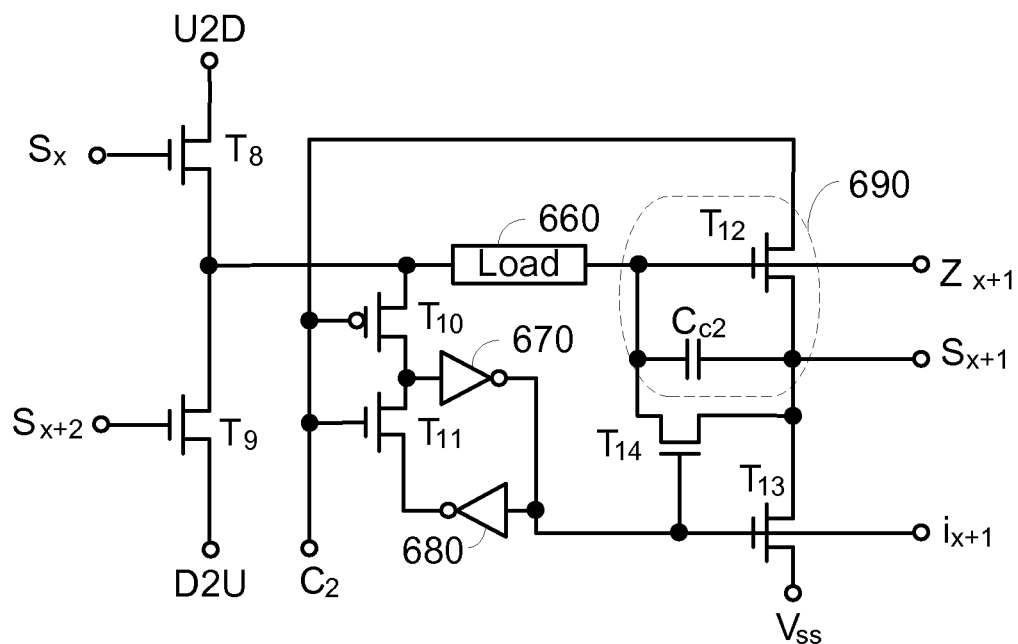
FIG. 4C is a schematic circuit diagram illustrating a first exemplary even-numbered (x+1)-th shift register of the multiplex driving circuit according to an embodiment.

FIG. 4A is a schematic circuit diagram illustrating a first exemplary odd-numbered x-th shift register of the multiplex driving circuit according to an embodiment. FIG. 4B is a schematic timing waveform diagram illustrating associated signal processed by the x-th shift register of FIG. 4A. FIG. 4C is a schematic circuit diagram illustrating a first exemplary even-numbered (x+1)-th shift register of the multiplex driving circuit according to an embodiment. As shown in FIG. 4A, the first clock signal $C_1$ is received by the odd-numbered x-th shift register. As shown in FIG. 4C, the second clock signal $C_2$ is received by the even-numbered (x+1)-th shift register. Since these two shift registers are only distinguished in the received clock signals, the operating principles of the x-th shift register of FIG. 4A are illustrated. The operating principles of the (x+1)-th shift register of FIG. 4C are similar to those of the x-th shift register of FIG. 4A, and are not redundantly described herein.

Please refer to FIG. 4A. The x-th shift register comprises a first transistor $T_1$, a second transistor $T_2$, a third transistor $T_3$, a fourth transistor $T_4$, a load 610, a first NOT gate 620, a second NOT gate 630, a fifth transistor $T_5$, a first capacitor $C_{c1}$, a sixth transistor $T_6$ and a seventh transistor $T_7$. A first voltage U2D (e.g. a gate high voltage $V_{gh}$) is received by the drain terminal of the first transistor $T_1$. The (x–1)-th master signal $S_{x-1}$ from the (x–1)-th shift register is received by the gate terminal of the first transistor $T_1$. The drain terminal of the second transistor $T_2$ is connected with the source terminal of the first transistor $T_1$. The (x+1)-th master signal $S_{x+1}$ from the (x+1)-th shift register is received by the gate terminal of the second transistor $T_2$. A second voltage D2U (e.g. a low voltage signal $V_{ss}$) is received by the source terminal of the second transistor $T_2$. The first voltage U2D and the second voltage D2U are control signals, which are adjustable.

The source terminal of the third transistor $T_3$ is connected with the source terminal of the first transistor $T_1$. The first clock signal $C_1$ is received by the gate terminal of the third transistor $T_3$. The drain terminal of the fourth transistor $T_4$ is connected with the drain terminal of the third transistor $T_3$. The first clock signal $C_1$ is also received by the gate terminal of the fourth transistor $T_4$.

A first end of the load 610 is connected with the source terminal of the third transistor $T_3$. The input terminal of the first NOT gate 620 is connected with the drain terminal of the third transistor $T_3$. The input terminal of the second NOT gate 630 is connected with the output terminal of the first NOT gate 620. The output terminal of the second NOT gate 630 is connected with the source terminal of the fourth transistor $T_4$. In this embodiment, the load 610 is equivalent to a resistor. Alternatively, the load 610 may be replaced by a transistor.

The fifth transistor $T_5$ and the first capacitor $C_{c1}$ are collectively defined as a voltage boost stage 640. The first clock signal $C_1$ is also received by the drain terminal of the fifth transistor $T_5$. The gate terminal of the fifth transistor $T_5$ is connected with a second end of the load 610. A first end of the first capacitor $C_{c1}$ is connected with the gate terminal of the fifth transistor $T_5$. A second end of the first capacitor $C_{c1}$ is connected with the source terminal of the fifth transistor $T_5$. In addition, an x-th high voltage signal $Z_x$ is outputted from the gate terminal of the fifth transistor $T_5$. An x-th master signal $S_x$ is outputted from the source terminal of the fifth transistor $T_5$.

The gate terminal of the sixth transistor $T_6$ is connected with the output terminal of the first NOT gate 620. The drain terminal of the sixth transistor $T_6$ is connected with the source terminal of the fifth transistor $T_5$. A low voltage signal $V_{ss}$ is received by the source terminal of the sixth transistor $T_6$. The drain terminal of the seventh transistor $T_7$ is connected with the second end of the load 610. The source terminal of the seventh transistor $T_7$ is connected with the source terminal of the fifth transistor $T_5$. The gate terminal of the seventh transistor $T_7$ is connected with the output terminal of the second NOT gate 630. In addition, an x-th control signal $i_x$ is outputted from the gate terminal of the sixth transistor $T_6$.

Please refer to FIG. 4B. From the time spot $t_1$ to the time spot $t_2$, the (x–1)-th master signal $S_{x-1}$ is in the high logic state, and the first clock signal $C_1$ is in the low logic state. Consequently, the x-th high voltage signal $Z_x$ is increased from the voltage level $V_{ss}$ to the voltage level ($V_{gh}$–$V_{th}$), wherein $V_{ss}$ is the threshold voltage of the first transistor $T_1$. In addition, since the third transistor $T_3$ is turned on but the fourth transistor $T_4$ is turned off, the x-th control signal $i_x$ is changed from the high logic state to the low logic state. Like the first clock signal $C_1$, the x-th master signal $S_x$ is also in the low logic state.

From the time spot $t_2$ to the time spot $t_3$, the (x–1)-th master signal $S_{x-1}$ is changed to the low logic state, and the first clock signal $C_1$ is changed to the high logic state. Meanwhile, the fourth transistor $T_4$ is turned on, the first NOT gate 620 and the second NOT gate 630 are collectively defined as a latch, and the x-th control signal $i_x$ is maintained in the low logic state. Since the fifth transistor $T_5$ of the voltage boost stage 640 is turned on and the first clock signal $C_1$ is in the high logic state, the first capacitor $C_{c1}$ allows the x-th high voltage signal $Z_x$ to be increased to the highest voltage $V_{hst}$, wherein Vhst=2 ($V_{gh}$–$V_{ss}$)–$V_{th}$. Like the first clock signal $C_1$, the x-th master signal $S_x$ is also in the high logic state. In this embodiment, in response to the highest voltage $V_{hst}$ of the x-th high voltage signal $Z_x$, the n driving stages generates the gate driving signals $Y_1$~$Y_n$ according to the slave signals.

At the time spot $t_3$, the (x+1)-th master signal $S_{x+1}$ is changed to the high logic state, and the first clock signal $C_1$ is changed to the low logic state. Since the third transistor $T_3$ is turned on, the x-th control signal $i_x$ is changed from the low logic state to the high logic state. In addition, since the sixth transistor $T_6$ and the seventh transistor $T_7$ are both turned on, the x-th master signal $S_x$ and the x-th high voltage signal $Z_x$ are restored to the low voltage signal $V_{ss}$.

Figure 5A:
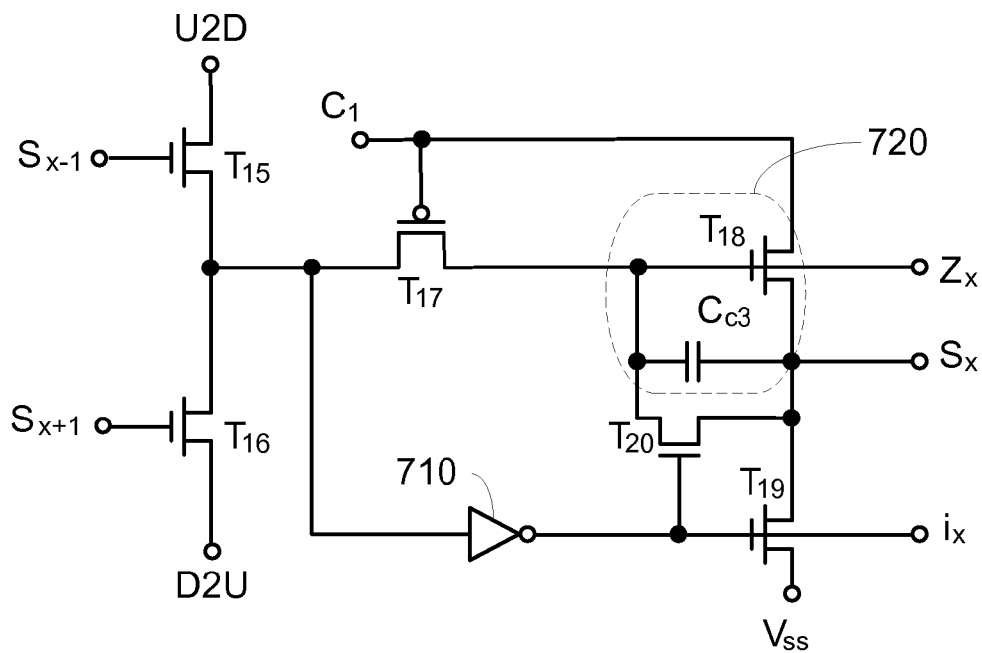
FIG. 5A is a schematic circuit diagram illustrating a second exemplary odd-numbered x-th shift register of the multiplex driving circuit according to an embodiment.
Figure 5B:
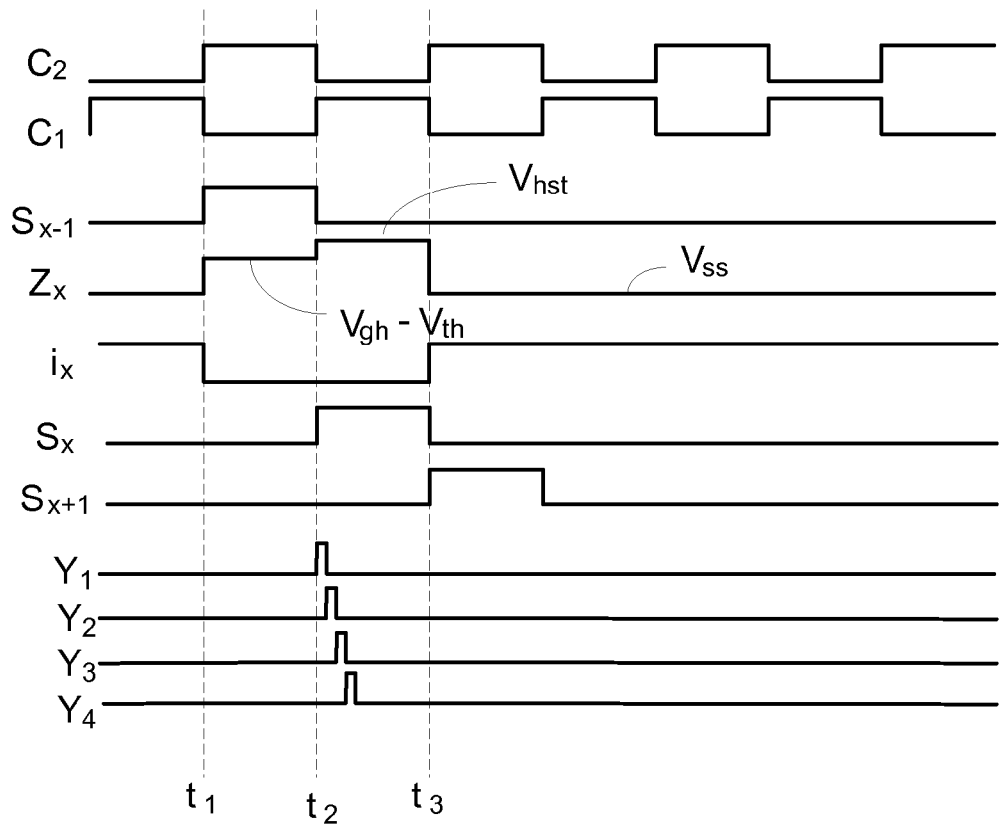
FIG. 5B is a schematic timing waveform diagram illustrating associated signal processed by the x-th shift register of FIG. 5A.
Figure 5C:
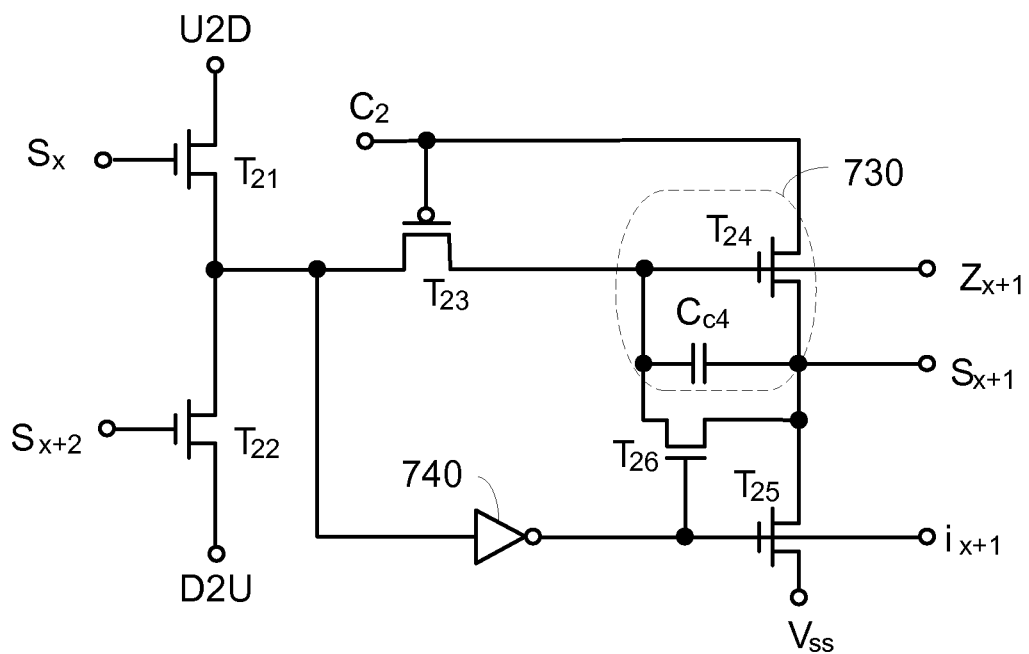
FIG. 5C is a schematic circuit diagram illustrating a second exemplary even-numbered (x+1)-th shift register of the multiplex driving circuit according to an embodiment.

FIG. 5A is a schematic circuit diagram illustrating a second exemplary odd-numbered x-th shift register of the multiplex driving circuit according to an embodiment. FIG. 5B is a schematic timing waveform diagram illustrating associated signal processed by the x-th shift register of FIG. 5A. FIG. 5C is a schematic circuit diagram illustrating a second exemplary even-numbered (x+1)-th shift register of the multiplex driving circuit according to an embodiment. As shown in FIG. 5A, the first clock signal $C_1$ is received by the odd-numbered x-th shift register. As shown in FIG. 5C, the second clock signal $C_2$ is received by the even-numbered (x+1)-th shift register. Since these two shift registers are only distinguished in the received clock signals, the operating principles of the x-th shift register of FIG. 5A are illustrated. The operating principles of the (x+1)-th shift register of FIG. 5C are similar to those of the x-th shift register of FIG. 5A, and are not redundantly described herein.

Please refer to FIG. 5A. The x-th shift register comprises a fifteenth transistor $T_{15}$, a sixteenth transistor $T_{16}$, a seventeenth transistor $T_{17}$, a third NOT gate 710, an eighteenth transistor $T_{18}$, a third capacitor $C_a$, a nineteenth transistor $T_{19}$ and a twentieth transistor $T_{20}$. A first voltage U2D (e.g. a gate high voltage $V_{gh}$) is received by the drain terminal of the fifteenth transistor $T_{15}$. The (x−1)-th master signal $S_{x-1}$ from the (x−1)-th shift register is received by the gate terminal of the fifteenth transistor $T_{15}$. The drain terminal of the sixteenth transistor $T_{16}$ is connected with the source terminal of the fifteenth transistor $T_{15}$. The (x+1)-th master signal $S_{x+1}$ from the (x+1)-th shift register is received by the gate terminal of the sixteenth transistor $T_{16}$. A second voltage D2U (e.g. a low voltage signal $V_{ss}$) is received by the source terminal of the sixteenth transistor $T_{16}$. The first voltage U2D and the second voltage D2U are control signals, which are adjustable.

The source terminal of the seventeenth transistor $T_{17}$ is connected with the source terminal of the fifteenth transistor $T_{15}$. The first clock signal $C_1$ is received by the gate terminal of the seventeenth transistor $T_{17}$. The input terminal of the third NOT gate 710 is connected with the source terminal of the fifteenth transistor $T_{15}$.

The eighteenth transistor $T_{18}$ and the third capacitor $C_a$ are collectively defined as a voltage boost stage 720. The first clock signal $C_1$ is also received by the drain terminal of the eighteenth transistor $T_{18}$. The gate terminal of the eighteenth transistor $T_{18}$ is connected with the drain terminal of the seventeenth transistor $T_{17}$. A first end of the third capacitor $C_a$ is connected with the gate terminal of the eighteenth transistor $T_{18}$. A second end of the third capacitor $C_a$ is connected with the source terminal of the eighteenth transistor $T_{18}$. In addition, an x-th high voltage signal $Z_x$ is outputted from the gate terminal of the eighteenth transistor $T_{18}$. An x-th master signal $S_x$ is outputted from the source terminal of the eighteenth transistor $T_{18}$.

The gate terminal of the nineteenth transistor $T_{19}$ is connected with the output terminal of the third NOT gate 710. The drain terminal of the nineteenth transistor $T_{19}$ is connected with the source terminal of the eighteenth transistor $T_{18}$. A low voltage signal $V_{ss}$ is received by the source terminal of the nineteenth transistor $T_{19}$. The drain terminal of the twentieth transistor $T_{20}$ is connected with the gate terminal of the eighteenth transistor $T_{18}$. The source terminal of the twentieth transistor $T_{20}$ is connected with the source terminal of the eighteenth transistor $T_{18}$. The gate terminal of the twentieth transistor $T_{20}$ is connected with the output terminal of the third NOT gate 71. In addition, an x-th control signal $i_x$ is outputted from the gate terminal of the nineteenth transistor $T_{19}$.

Please refer to FIG. 5B. From the time spot $t_1$ to the time spot $t_2$, the (x−1)-th master signal $S_{x-1}$ is in the high logic state, and the first clock signal $C_1$ is in the low logic state. Consequently, the x-th high voltage signal $Z_x$ is increased from the voltage level $V_{ss}$ to the voltage level $(V_{gh}\sim V_{th})$, wherein $V_{ss}$ is the threshold voltage of the fifteenth transistor $T_{15}$. In addition, the x-th control signal $i_x$ is changed from the high logic state to the low logic state. Like the first clock signal $C_1$, the x-th master signal $S_x$ is also in the low logic state.

From the time spot $t_2$ to the time spot $t_3$, the (x−1)-th master signal $S_{x-1}$ is changed to the low logic state, and the first clock signal $C_1$ is changed to the high logic state. Meanwhile, the eighteenth transistor $T_{18}$ is continuously turned on, and the third capacitor $C_a$ allows the x-th high voltage signal $Z_x$ to be increased to the highest voltage $V_{hst}$, wherein Vhst=2($V_{gh}-V_{ss}$)−$V_{th}$. The x-th control signal $i_x$ is mastertained in the low logic state. Like the first clock signal $C_1$, the x-th master signal $S_x$ is also in the high logic state. In this embodiment, in response to the highest voltage $V_{hst}$ of the x-th high voltage signal $Z_x$, the n driving stages generates the gate driving signals $Y_1\sim Y_n$ according to the slave signals.

At the time spot $t_3$, the (x+1)-th master signal $S_{x+1}$ is changed to the high logic state, and the first clock signal $C_1$ is changed to the low logic state. Since the sixteenth transistor $T_{16}$ is turned on, the x-th control signal $i_x$ is changed from the low logic state to the high logic state. In addition, since the nineteenth transistor $T_{19}$ and the twentieth transistor $T_{20}$ are both turned on, the x-th master signal $S_x$ and the x-th high voltage signal $Z_x$ are restored to the low voltage signal $V_{ss}$.

FIGS. 6A~6F schematically illustrate some exemplary driving stages of the multiplex driving circuit according to the embodiment.

Figure 6A:
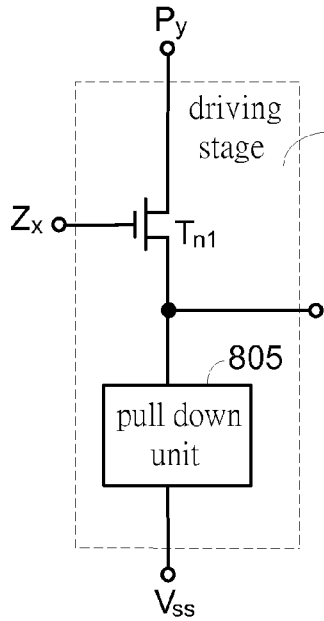
FIGS. 6A-6F schematically illustrate some exemplary driving stages of the multiplex driving circuit.

As shown in FIG. 6A, the driving stage 800 comprises a first n-type driving transistor $T_{n1}$ and a pull down unit 805. A y-th slave signal $P_y$ is received by the drain terminal of the first n-type driving transistor $T_{n1}$. The x-th high voltage signal $Z_x$ is received by the gate terminal of the first n-type driving transistor $T_{n1}$. A y-th gate driving signal $Y_y$ is outputted from the source terminal of the first n-type driving transistor $T_{n1}$. In a case that the first n-type driving transistor $T_{n1}$ is disabled, the pull down unit 805 is turned on. The pull down unit 805 is interconnected between the source terminal of the first n-type driving transistor $T_{n1}$ and a low voltage signal $V_{ss}$.

In this embodiment, the driving stage comprises two transistors. In response to the highest voltage $V_{hst}$ of the x-th high voltage signal $Z_x$, the first n-type driving transistor $T_{n1}$ is completely turned on. In such way, the y-th gate driving signal $Y_y$ is not suffered from distortion.

Figure 6B:
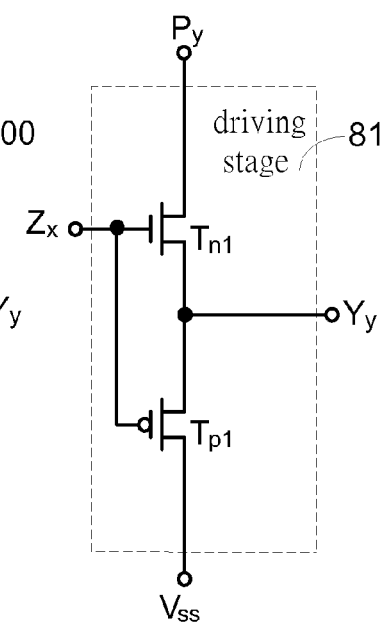

As shown in FIG. 6B, the driving stage 810 comprises a first n-type driving transistor $T_{n1}$ and a first p-type driving transistor $T_{p1}$. The y-th slave signal $P_y$ is received by the drain terminal of the first n-type driving transistor $T_{n1}$. The x-th high voltage signal $Z_x$ is received by the gate terminal of the first n-type driving transistor $T_{n1}$. The y-th gate driving signal $Y_y$ is outputted from the source terminal of the first n-type driving transistor $T_{n1}$. The x-th high voltage signal $Z_x$ is received by the gate terminal of the first p-type driving transistor $T_{p1}$. The source terminal of the first p-type driving transistor $T_{p1}$ is connected with the source terminal of the first n-type driving transistor $T_{n1}$. The low voltage signal $V_{ss}$ is received by the drain terminal of the first p-type driving transistor $T_{p1}$.

Figure 6C:
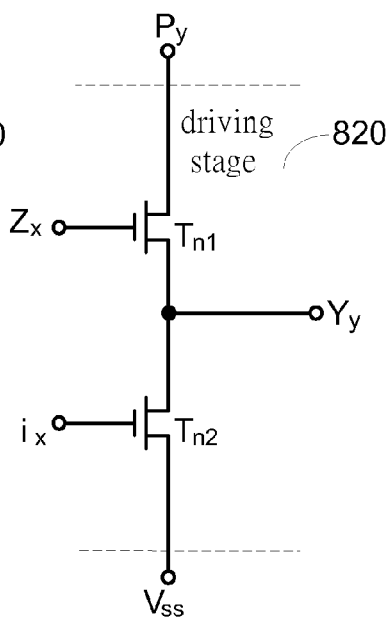

As shown in FIG. 6C, the driving stage 820 comprises a first n-type driving transistor $T_{n1}$ and a second n-type driving transistor $T_{n2}$. The y-th slave signal $P_y$ is received by the drain terminal of the first n-type driving transistor $T_{n1}$. The x-th high voltage signal $Z_x$ is received by the gate terminal of the first n-type driving transistor $T_{n1}$. The y-th gate driving signal $Y_y$ is outputted from the source terminal of the first n-type driving transistor $T_{n1}$. The x-th control signal $i_x$ is received by the gate terminal of the second n-type driving transistor T. The source terminal of the second n-type driving transistor $T_{n2}$ is connected with the source terminal of the first n-type driving transistor $T_{n1}$. The low voltage signal $V_{ss}$ is received by the drain terminal of the second n-type driving transistor $T_{n2}$.

Figure 6D:
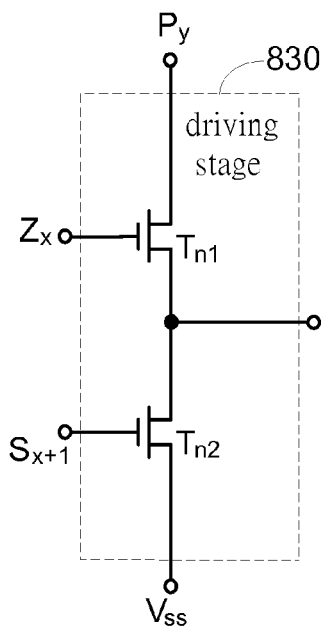

As shown in FIG. 6D, the driving stage 830 comprises a first n-type driving transistor $T_{n1}$ and a second n-type driving transistor $T_{n2}$. The y-th slave signal $P_y$ is received by the drain terminal of the first n-type driving transistor $T_{n1}$. The x-th high voltage signal $Z_x$ is received by the gate terminal of the first n-type driving transistor $T_{n1}$. The y-th gate driving signal $Y_y$ is outputted from the source terminal of the first n-type driving transistor $T_{n1}$. The (x+1)-th master signal $S_{x+1}$ is received by the gate terminal of the second n-type driving transistor T. The source terminal of the second n-type driving transistor $T_{n2}$ is connected with the source terminal of the first n-type driving transistor $T_{n1}$. The low voltage signal $V_{ss}$ is received by the drain terminal of the second n-type driving transistor $T_{n2}$.

Figure 6E:
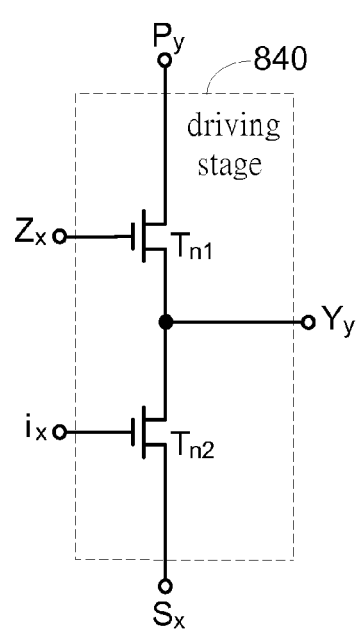

As shown in FIG. 6E, the driving stage 840 comprises a first n-type driving transistor $T_{n1}$ and a second n-type driving transistor $T_{n2}$. The y-th slave signal $P_y$ is received by the drain terminal of the first n-type driving transistor $T_{n1}$. The x-th high voltage signal $Z_x$ is received by the gate terminal of the first n-type driving transistor $T_{n1}$. The y-th gate driving signal $Y_y$ is outputted from the source terminal of the first n-type driving transistor $T_{n1}$. The x-th control signal $i_x$ is received by the gate terminal of the second n-type driving transistor T. The source terminal of the second n-type driving transistor $T_{n2}$ is connected with the source terminal of the first n-type driving transistor $T_{n1}$. The x-th master signal $S_x$ is received by the drain terminal of the second n-type driving transistor $T_{n2}$.

Figure 6F:
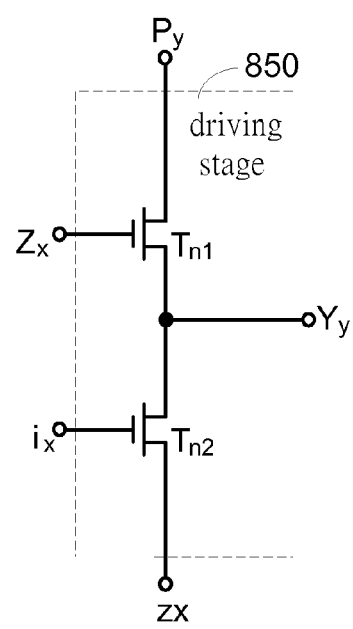

As shown in FIG. 6F, the driving stage 850 comprises a first n-type driving transistor $T_{n1}$ and a second n-type driving transistor $L_2$. The y-th slave signal $P_y$ is received by the drain terminal of the first n-type driving transistor $T_{n1}$. The x-th high voltage signal $Z_x$ is received by the gate terminal of the first n-type driving transistor $T_{n1}$. The y-th gate driving signal $Y_y$ is outputted from the source terminal of the first n-type driving transistor $T_{n1}$. The x-th control signal $i_x$ is received by the gate terminal of the second n-type driving transistor T. The source terminal of the second n-type driving transistor $T_{n2}$ is connected with the source terminal of the first n-type driving transistor $T_{n1}$. The x-th high voltage signal $Z_x$ is received by the drain terminal of the second n-type driving transistor $T_{n2}$.

It is noted that the fifteenth transistor $T_{15}$, the sixteenth transistor $T_{16}$ and the seventeenth transistor $T_{17}$ of the shift register of FIG. 5A are used as switch units. That is, these switch units may be replaced by transmission gates or different types of transistors. Hereinafter, some variations of the shift register will be illustrated with reference to FIGS. 7A~7D.

Figure 7A:
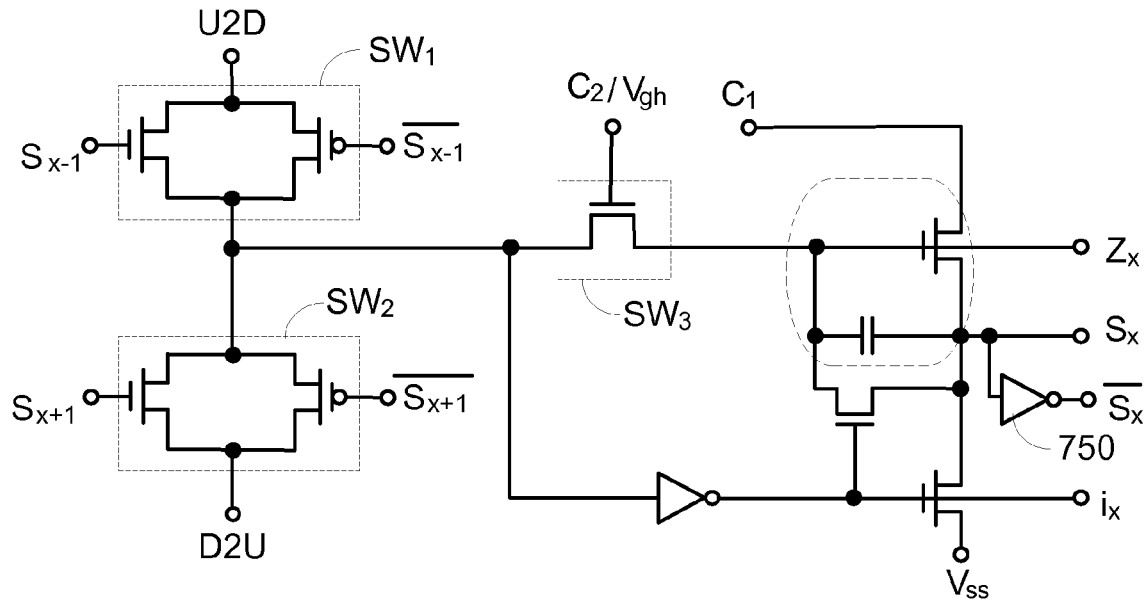
FIG. 7A is a schematic circuit diagram illustrating a third exemplary x-th shift register of the multiplex driving circuit according to an embodiment.

FIG. 7A is a schematic circuit diagram illustrating a third exemplary x-th shift register of the multiplex driving circuit according to an embodiment. The connecting relationships of the components of the shift register shown in FIG. 7A are similar to those of FIG. 5A, and are not redundantly described herein. In the shift register shown in FIG. 7A, the fifteenth transistor $T_{15}$, the sixteenth transistor $T_{16}$ and the seventeenth transistor $T_{17}$ of the shift register of FIG. 5A are replaced by a first switch unit $SW_1$, a second switch unit $SW_2$ and a third switch unit $SW_3$, respectively. The first switch unit $SW_1$ is a transmission gate. The first switch unit $SW_1$ is operated according to the (x−1)-th master signal $S_{x-1}$ and the inverted (x−1)-th master signal $\overline{S_{x-1}}$. The second switch unit $SW_2$ is also a transmission gate. The second switch unit $SW_2$ is operated according to the (x+1)-th master signal $S_{x+1}$ and the inverted (x+1)-th master signal $\overline{S_{x+1}}$. The third switch unit $SW_3$ is an n-type transistor. The third switch unit $SW_3$ is operated according to the second clock signal $C_2$ or the high voltage $V_{gh}$. Moreover, the x-th master signal $S_x$ is inputted into an NOT gate 750, and thus an inverted x-th master signal $\overline{S_x}$ is outputted from the NOT gate 750.

Figure 7B:
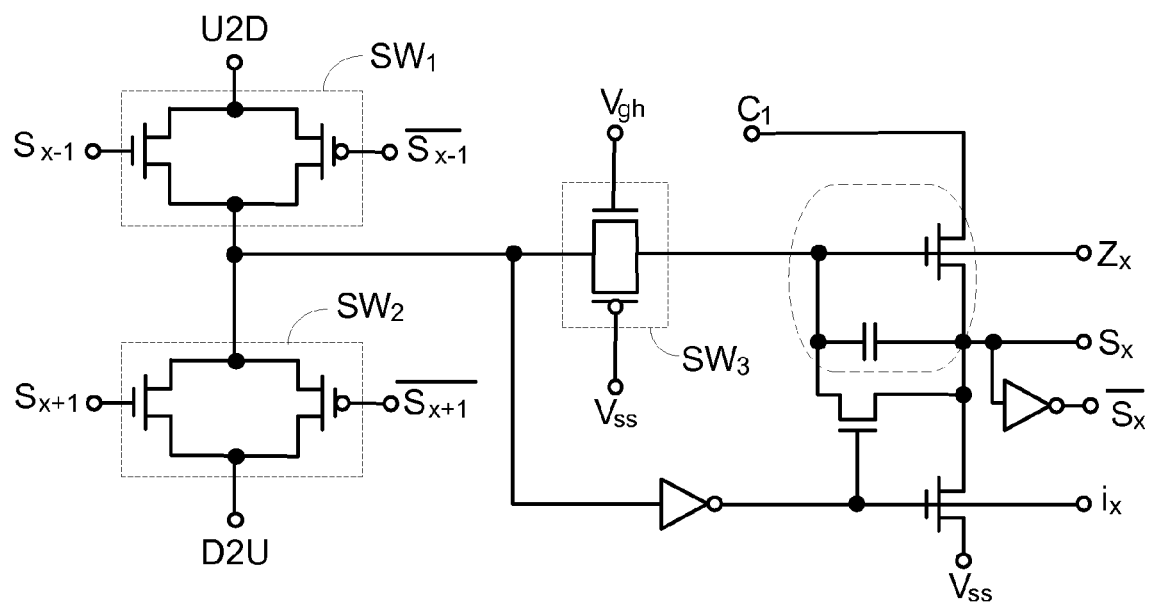
FIG. 7B is a schematic circuit diagram illustrating a fourth exemplary x-th shift register of the multiplex driving circuit according to an embodiment.

FIG. 7B is a schematic circuit diagram illustrating a fourth exemplary x-th shift register of the multiplex driving circuit according to an embodiment. The connecting relationships of the components of the shift register shown in FIG. 7B are similar to those of FIG. 5A, and are not redundantly described herein. In the shift register shown in FIG. 7A, the fifteenth transistor $T_{15}$, the sixteenth transistor $T_{16}$ and the seventeenth transistor $T_{17}$ of the shift register of FIG. 5A are replaced by a first switch unit $SW_1$, a second switch unit $SW_2$ and a third switch unit $SW_3$, respectively. The first switch unit $SW_1$ is a transmission gate. The first switch unit $SW_1$ is operated according to the (x−1)-th master signal $S_{x-1}$ and the inverted (x−1)-th master signal $\overline{S_{x-1}}$. The second switch unit $SW_2$ is also a transmission gate. The second switch unit $SW_2$ is operated according to the (x+1)-th master signal $S_{x+1}$ and the inverted (x+1)-th master signal $\overline{S_{x+1}}$. The third switch unit $SW_3$ is also a transmission gate.

The third switch unit $SW_3$ is operated according to the high voltage $V_{gh}$ or the low voltage signal $V_{ss}$. Moreover, the x-th master signal $S_x$ is inputted into an NOT gate 750, and thus an inverted x-th master signal $\overline{S_x}$ is outputted from the NOT gate 750.

Figure 7C:
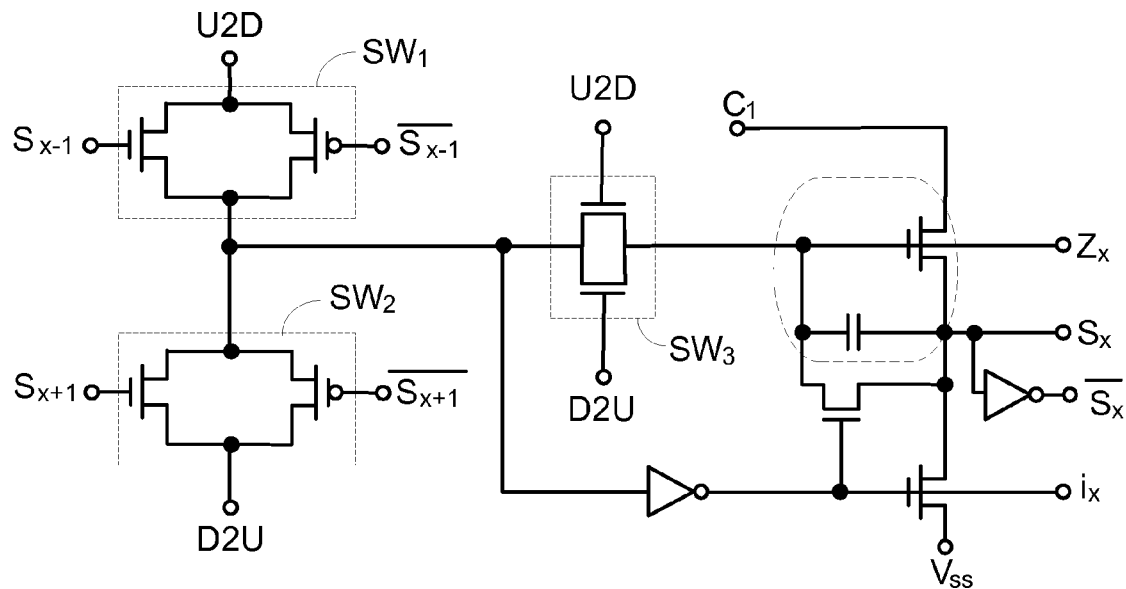
FIG. 7C is a schematic circuit diagram illustrating a fifth exemplary x-th shift register of the multiplex driving circuit according to an embodiment.

FIG. 7C is a schematic circuit diagram illustrating a fifth exemplary x-th shift register of the multiplex driving circuit according to an embodiment. The connecting relationships of the components of the shift register shown in FIG. 7C are similar to those of FIG. 5A, and are not redundantly described herein. In the shift register shown in FIG. 7A, the fifteenth transistor $T_{15}$, the sixteenth transistor $T_{16}$ and the seventeenth transistor $T_{17}$ of the shift register of FIG. 5A are replaced by a first switch unit $SW_1$, a second switch unit $SW_2$ and a third switch unit $SW_3$, respectively. The first switch unit $SW_1$ is a transmission gate. The first switch unit $SW_1$ is operated according to the (x−1)-th master signal $S_{x-1}$ and the inverted (x−1)-th master signal $\overline{S_{x-1}}$. The second switch unit $SW_2$ is also a transmission gate. The second switch unit $SW_2$ is operated according to the (x+1)-th master signal $S_{x+1}$ and the inverted (x+1)-th master signal $\overline{S_{x+1}}$. The third switch unit $SW_3$ includes two n-type transistors, which are connected with each other in parallel. The third switch unit $SW_3$ is operated according to the first voltage U2D and the second voltage D2U. Moreover, the x-th master signal $S_x$ is inputted into an NOT gate 750, and thus an inverted x-th master signal $\overline{S_x}$ is outputted from the NOT gate 750.

Figure 7D:
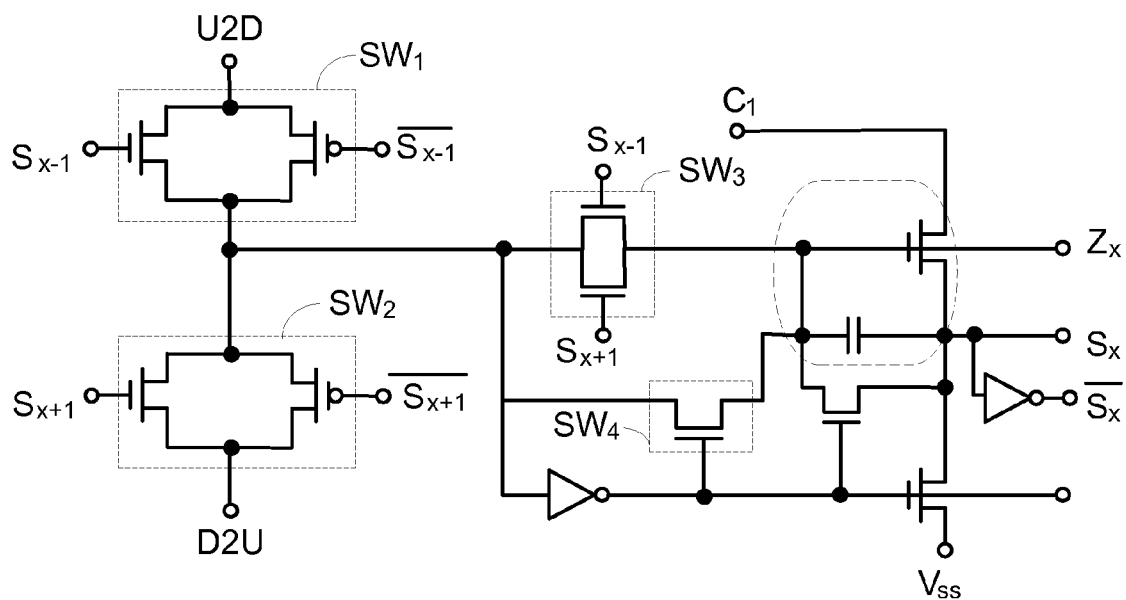
FIG. 7D is a schematic circuit diagram illustrating a sixth exemplary x-th shift register of the multiplex driving circuit according to an embodiment.

FIG. 7D is a schematic circuit diagram illustrating a sixth exemplary x-th shift register of the multiplex driving circuit according to an embodiment. The connecting relationships of the components of the shift register shown in FIG. 7D are similar to those of FIG. 5A, and are not redundantly described herein. In the shift register shown in FIG. 7A, the fifteenth transistor $T_{15}$, the sixteenth transistor $T_{16}$ and the seventeenth transistor $T_{17}$ of the shift register of FIG. 5A are replaced by a first switch unit $SW_1$, a second switch unit $SW_2$ and a third switch unit $SW_3$, respectively. The first switch unit $SW_1$ is a transmission gate. The first switch unit $SW_1$ is operated according to the (x−1)-th master signal $S_{x-1}$ and the inverted (x−1)-th master signal $\overline{S_{x-1}}$. The second switch unit $SW_2$ is also a transmission gate. The second switch unit $SW_2$ is operated according to the (x+1)-th master signal $S_{x+1}$ and the inverted (x+1)-th master signal $\overline{S_{x+1}}$. The third switch unit $SW_3$ includes two n-type transistors, which are connected with each other in parallel. The third switch unit $SW_3$ is operated according to the (x−1)-th master signal $S_{x-1}$ and the (x+1)-th master signal $S_{x+1}$. Moreover, the x-th master signal $S_x$ is inputted into an NOT gate 750, and thus an inverted x-th master signal $\overline{S_x}$ is outputted from the NOT gate 750.

From the above description, the disclosure provides a multiplex driving circuit. The multiplex driving circuit has a voltage boost stage for providing a high voltage signal to plural driving voltages. According to the high voltage signal and the slave signals, the driving voltages generate plural gate driving signals. In response to the highest voltage of the high voltage signal, the plural gate driving signals outputted from the driving stages are not suffered from distortion.

While the disclosure has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A multiplex driving circuit receiving m master signals and n slave signals, the multiplex driving circuit comprising m driving modules for generating m×n gate driving signals, wherein each driving module comprises:
    a voltage boost stage for receiving a first master signal of the m master signals and converting the first master signal into a first high voltage signal, wherein a high logic level of the first master signal is increased to a highest voltage by the voltage boost stage; and
    n driving stages for respectively receiving the n slave signals and receiving the first high voltage signal, wherein in response to the highest voltage of the first high voltage signal, the n driving stages sequentially generates n gate driving signals according to the n slave signals;
    wherein a time duration of the high logic level of each master signal is equal to a cycle period of each slave signal, a duty cycle of each slave signal is equal to 1/n, and a phase difference between every two adjacent slave signals is equal to 360/n degrees.

2. A multiplex driving circuit receiving m master signals and n slave signals, the multiplex driving circuit comprising m driving modules for generating m×n gate driving signals, wherein each driving module comprises:
    a voltage boost stage for receiving a first master signal of the m master signals and converting the first master signal into a first high voltage signal, wherein a high logic level of the first master signal is increased to a highest voltage by the voltage boost stage; and
    n driving stages for respectively receiving the n slave signals and receiving the first high voltage signal, wherein in response to the highest voltage of the first high voltage signal, the n driving stages sequentially generates n gate driving signals according to the n slave signals;
    wherein each driving stage comprises:
    a first n-type driving transistor having a drain terminal receiving a first slave signal of the n slave signals, a gate terminal receiving the first high voltage signal and a source terminal generating a first gate driving signal of the n gate driving signals; and
    a pull down unit interconnected between a source terminal of the first n-type driving transistor and a low voltage signal.

3. The multiplex driving circuit according to claim 2, wherein the pull down unit includes a first p-type driving transistor, wherein the first p-type driving transistor has a gate terminal receiving the first high voltage signal, a source terminal connected with the source terminal of the first n-type driving transistor and a drain terminal receiving the low voltage signal.

4. The multiplex driving circuit according to claim 3, wherein a time duration of the high logic level of each master signal is equal to a cycle period of each slave signal, a duty cycle of each slave signal is equal to 1/n, and a phase difference between every two adjacent slave signals is equal to 360/n degrees.

5. The multiplex driving circuit according to claim 2, wherein a time duration of the high logic level of each master signal is equal to a cycle period of each slave signal, a duty cycle of each slave signal is equal to 1/n, and a phase difference between every two adjacent slave signals is equal to 360/n degrees.

* * * * *